(12) United States Patent
Vashchenko

(10) Patent No.: US 7,943,958 B1
(45) Date of Patent: May 17, 2011

(54) HIGH HOLDING VOLTAGE LVTSCR-LIKE STRUCTURE

(75) Inventor: Vladislav Vashchenko, Fremont, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/944,426

(22) Filed: Aug. 30, 2001

(51) Int. Cl.
*H01L 29/74* (2006.01)
*H01L 23/62* (2006.01)
(52) U.S. Cl. ........................ 257/173; 257/355
(58) Field of Classification Search .......... 257/355–363, 257/173
See application file for complete search history.

(56) References Cited

U.S. PATENT DOCUMENTS

| | | | | |
|---|---|---|---|---|
| 4,956,311 A * | 9/1990 | Liou et al. | | 438/231 |
| 5,361,185 A * | 11/1994 | Yu | | 361/111 |
| 5,572,394 A * | 11/1996 | Ker et al. | | 361/56 |
| 5,903,420 A * | 5/1999 | Ham | | 361/56 |
| 6,465,848 B2 * | 10/2002 | Ker et al. | | 257/355 |
| 6,493,199 B1 * | 12/2002 | Su et al. | | 361/56 |
| 6,573,566 B2 * | 6/2003 | Ker et al. | | 257/355 |
| 6,720,624 B1 * | 4/2004 | Vashchenko et al. | | 257/360 |

* cited by examiner

*Primary Examiner* — Ori Nadav
(74) *Attorney, Agent, or Firm* — Jurgen K. Vollrath; Vollrath & Associates

(57) ABSTRACT

In an ESD protection device making use of a LVTSCR structure, the holding voltage is increased by forming diodes in the p-well of the LVTSCR structure. This provides an alternative current path at high currents and provides a defined voltage drop thereby increasing the holding voltage.

2 Claims, 7 Drawing Sheets

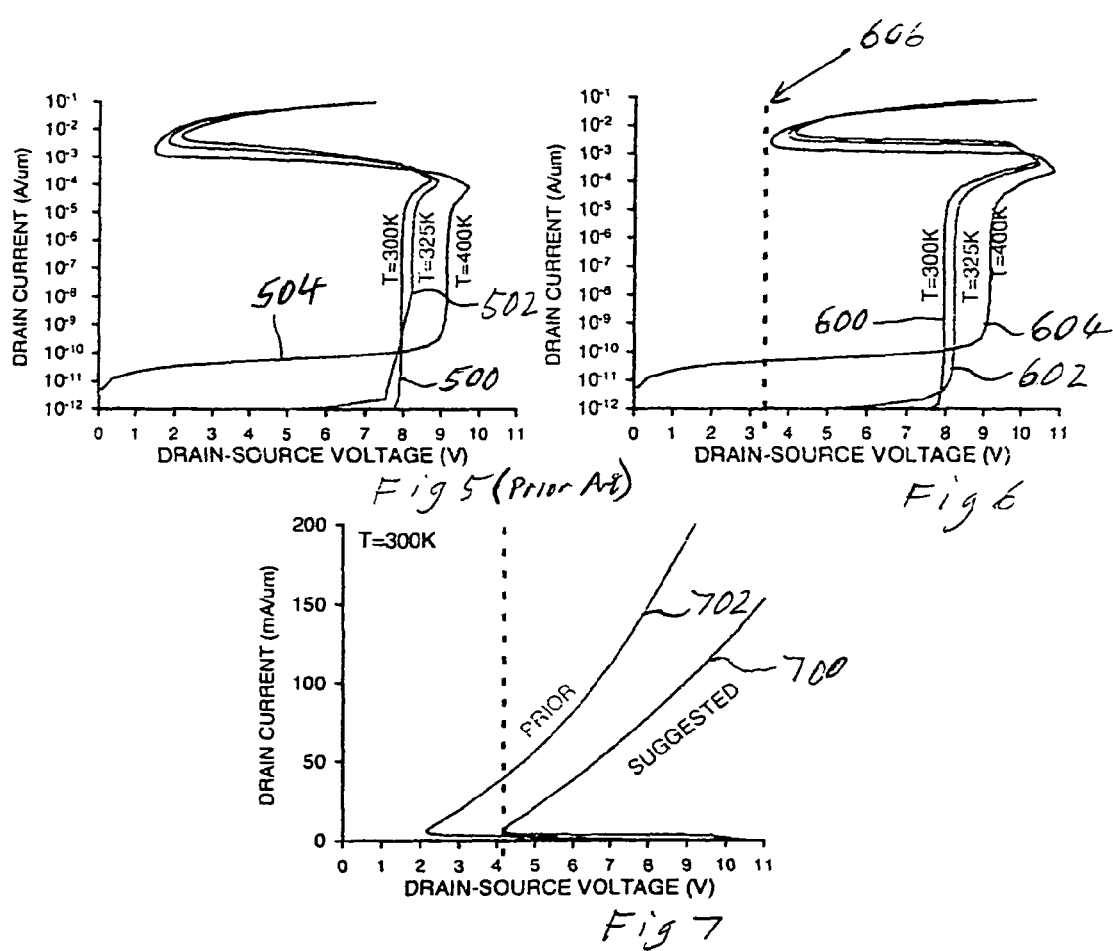

HIGH HOLDING VOLTAGE LVTSCR-LIKE STRUCTURE

FIELD OF THE INVENTION

The invention relates to ESD protection devices. More particularly, it relates to LVTSCR-like devices for protecting CMOS and Bi-CMOS integrated circuits against electrostatic discharge and electrical overstress.

BACKGROUND OF THE INVENTION

Analog circuits typically display sensitivity to excessive voltage levels. Transients, such as electrostatic discharges (ESD) can cause the voltage handling capabilities of the analog circuit to be exceeded, resulting in damage to the analog circuit. Clamps have been devised to shunt current to ground during excessive voltage peaks.

One of the difficulties encountered in designing such protection circuitry is that the specifications for these clamps have to fit within a relatively small design window that, on the one hand, must take into account the breakdown voltage of the circuit being protected, and, on the other hand, avoid latch-up under normal operation. Thus, the clamp must be designed so as to be activated below the breakdown voltage of the circuit that is to be protected. At the same time, the latch-up or holding voltage must exceed the normal operating voltage of the protected circuit.

Some protection clamps employ avalanche diodes such as zener diodes to provide the bias voltage for the base of a subsequent power bipolar junction transistor (BJT).

Grounded gate NMOS devices (GGNMOS) have also been used as ESD protection devices. However, GGNMOS devices are not only large, consuming a lot of space on a chip, they also suffer from the disadvantage that they support only limited current densities. The protection capability of an ESD protection device can be defined as the required contact width of the structure required to protect against an ESD pulse amplitude, or, stated another way, as the maximum protected ESD pulse amplitude for a given contact width. Thus, the smaller the contact width for a given ESD pulse amplitude protection, the better. One possible ESD protection solution is to use a silicon-controlled rectifier (SCR).

A silicon-controlled rectifier (SCR) is a device that provides an open circuit between a first node and a second node when the voltage across the first and second nodes is positive and less than a trigger voltage. When the voltage across the first and second nodes rises to be equal to or greater than the trigger voltage, the SCR provides a low-resistance current path between the first and second nodes. Further, once the low-resistance current path has been provided, the SCR maintains the current path as long as the voltage across the first and second nodes is equal to or greater than a holding voltage that is lower than the trigger voltage. As a result of these characteristics, SCRs have been used to provide ESD protection. When used for ESD protection, the first node becomes a to-be-protected node, and the second node is typically connected to ground. The SCR operates within an ESD protection window that has a maximum voltage defined by the destructive breakdown level of the to-be-protected node, and a minimum voltage (also known as a latch-up voltage) defined by any dc bias on the to-be-protected node.

Thus, when the voltage across the to-be-protected node and the second node is less than the trigger voltage, the SCR provides an open circuit between the to-be-protected node and the second node. However, when the to-be-protected node receives a voltage spike that equals or exceeds the trigger voltage, such as when an ungrounded human-body discharge occurs, the SCR provides a low-resistance current path from the to-be-protected node to the second node. In addition, once the ESD event has passed and the voltage on the to-be-protected node falls below the holding voltage, the SCR again provides an open circuit between the to-be-protected node and the second node.

FIG. 1 shows a cross-sectional view that illustrates a conventional SCR 100. As shown in FIG. 1, SCR 100 has a n-well 112 which is formed in a p-type semiconductor material 110, such as a substrate or a well, and a n+ region 114 and a p+ region 116 which are formed in n-well 112. The n+ and p+ regions 114 and 116 are both connected to a to-be-protected node 120. As further shown in FIG. 1, SCR 100 also has a n+ region 122 and a p+ region 124 formed in semiconductor material 110. The n+ and p+ regions 122 and 124 are both connected to an output node 126.

In operation, when the voltage across nodes 120 and 126 is positive and less than the trigger voltage, the voltage reverse biases the junction between n-well 112 and p-type material 110. The reverse-biased junction, in turn, blocks charge carriers from flowing from node 120 to node 126. However, when the voltage across nodes 120 and 126 is positive and equal to or greater than the trigger voltage, the reverse-biased junction breaks down due to avalanche multiplication.

The breakdown of the junction causes a large number of holes to be injected into material 110, and a large number of electrons to be injected into n-well 112. The increased number of holes increases the potential of material 110 in the region that lies adjacent to n+ region 122, and eventually forward biases the junction between material 110 and n+ region 122.

When the increased potential forward biases the junction, a npn transistor that utilizes n+ region 122 as the emitter, p-type material 110 as the base, and n-well 112 as the collector turns on. When turned on, n+ (emitter) region 122 injects electrons into (base) material 110. Most of the injected electrons diffuse through (base) material 110 and are swept from (base) material 110 into (collector) n-well 112 by the electric field that extends across the reverse-biased junction. The electrons in (collector) n-well 112 are then collected by n+ region 114.

A small number of the electrons injected into (base) material 110 recombine with holes in (base) material 110 and are lost. The holes lost to recombination with the injected electrons are replaced by holes injected into (base) material 110 by the broken-down reverse-biased junction and, as described below, by the collector current of a pnp transistor, thereby providing the base current.

The electrons that are injected and swept into n-well 112 also decrease the potential of n-well 112 in the region that lies adjacent to p+ region 116, and eventually forward bias the junction between p+ region 116 and n-well 112. When the decreased potential forward biases the junction between p+ region 116 and n-well 112, a pnp transistor formed from p+ region 116, n-well 112, and material 110, turns on.

When turned on, p+ emitter 116 injects holes into base 112. Most of the injected holes diffuse through (base) n-well 112 and are swept from (base) n-well 112 into (collector) material 110 by the electric field that extends across the reverse-biased junction. The holes in (collector) material 110 are then collected by p+ region 124.

A small number of the holes injected into (base) n-well 112 recombine with electrons in (base) n-well 112 and are lost. The electrons lost to recombination with the injected holes are replaced by electrons flowing into n-well 112 as a result of the broken-down reverse-biased junction, and n-well 112 being the collector of the npn transistor. Thus, a small part of the npn collector current forms the base current of the pnp transistor.

Similarly, as noted above, the holes swept into (collector) material 110 also provide the base current holes necessary to compensate for the holes lost to recombination with the diffusing electrons injected by n+ (emitter) region 122. Thus, a small part of the pnp collector current forms the base current of the npn transistor.

Thus, n+ region 122 injects electrons that provide both the electrons for the collector current of the npn transistor as well as the electrons for the base current of the pnp transistor. At the same time, p+ region 116 injects holes that provide both the holes for the collector current of the pnp transistor as well as the holes for the base current of the npn transistor.

One of the advantages of SCR 100 over other ESD protection devices, such as a grounded-gate MOS transistor, is the double injection provided by n+ region 122 and p+ region 116 of SCR 100. With double injection, SCR 100 provides current densities (after snapback) that are about ten times greater than the densities provided by a grounded-gate MOS device.

One of the disadvantages of SCR 100, however, is that a very large positive voltage, e.g., 50 volts, must be dropped across nodes 120 and 126 before the junction between p-type material 110 and n-well 112 breaks down. As a result, SCR 100 can not be used to protect devices, such as MOS transistors, that can be permanently damaged by much lower voltages, e.g., 15 volts.

One solution proposed in the past, was to use low voltage silicon controlled rectifiers (LVTSCRs) which are not only smaller but allow the reaching of current densities, after snap back, that are some ten times higher than the current densities of traditionally used grounded gate NMOS devices (GGNMOS), thus increasing the ESD protection capability for CMOS circuits.

An LVTSCR incorporates a NMOS transistor into SCR 100. FIG. 2 shows a cross-sectional diagram that illustrates a conventional LVTSCR 200. LVTSCR 200 and SCR 100 are similar and, as a result, utilize the same reference numerals to designate the structures that are common to both devices.

As shown in FIG. 2, LVTSCR 200 differs from SCR 100 in that LVTSCR 200 has a n+ (drain) region 230 that is formed in both material 110 and n-well 112, and a channel region 232 that is defined between n+ (source) region 122 and n+ (drain) region 230. In addition, LVTSCR 200 includes a gate oxide layer 234 that is formed on material 110 over channel region 232, and a gate 236 that is formed on gate oxide layer 234. N+ (source and drain) regions 122 and 230, gate oxide layer 234, and gate 236 define a NMOS transistor 238 which is typically formed to be identical to the to-be-protected MOS transistors in the circuit.

In operation, when the voltage on the drain of a conventional NMOS transistor spikes up, the drain-to-substrate junction of the NMOS transistor breaks down, for example, at 7 volts, while the gate oxide layer that isolates the gate from the drain destructively breaks down at, for example, 10-15 volts.

Since NMOS transistor 238 is formed to be identical to the to-be-protected MOS transistors, the junction between n+ region 230 and material 110 breaks down at the same time that the to-be-protected MOS transistors experience junction break down as a result of an ESD pulse. Once the reverse-biased junction between region 230 and material 110 breaks down, the break down triggers LVTSCR 200 to operate the same as SCR 100.

Since junction break down occurs before the MOS transistors experience destructive gate oxide break down, LVTSCR 200 turns on before destructive gate oxide breakdown occurs, thereby protecting the MOS transistors. Thus, the junction breakdown voltage, which is less than the voltage level that causes destructive gate oxide break down, functions as the trigger voltage. In addition, other techniques, such as reducing the width of channel region 232, can be used to lower the trigger voltage so that the region 230 to material 110 junction breaks down before the to-be-protected MOS transistors experience junction breakdown.

Thus, LVTSCR 200 provides a SCR with a significantly lower turn-on voltage that allows MOS transistors to be protected from ESD events with an SCR. However, one disadvantage of LVTSCR 200, and, for that matter, any SCR is that it suffers from a holding voltage that is often less than the minimum (or latch-up) voltage of the ESD protection window. The low holding voltage of the LVTSCR which lies in the range of less than two volts, is due to the double junction injection of its conductivity modulation mechanism. While the p+ emitter allows one to define how many holes are injected, the injection of the holes leads to greater space charge neutralization and thus a lower holding voltage. As a result, standard LVTSCRs are unattractive candidates for providing ESD protection to power supply pins.

As mentioned above, the major requirement when designing ESD protection circuits, is that the circuit operate within a so-called "ESD protection window" that is usually limited by both the maximum voltage in the protected line (which is related to the breakdown of the protected circuits) and the latch-up voltage when the DC bias is presented in the protected line.

In the LVTSCR, when the minimum (or latch-up) voltage of the ESD protection window is equal to a dc bias, such as the power supply voltage, LVTSCR 200 cannot turn off (thus latching up) after the ESD event has passed. Thus, power must be cycled after the ESD event, to switch off the LVTSCR.

For example, assume that node 120 is a power supply pin at 3.3 volts, node 126 is a ground pin, the junction breakdown voltages of the to-be-protected MOS transistors are 7.0 volts, and the holding voltage is 1.8 volts. In this example, LVTSCR 200 is turned off under normal operating conditions when the voltage on node 120 is 3.3 volts. When the voltage on node 120 spikes up to a value equal to or greater than the trigger voltage (7 volts in this example), LVTSCR 200 turns on, thereby protecting the MOS devices that receive power from node 120. However, once the ESD event has passed, since the normal operating voltage on node 120 is 3.3 volts, and it takes only 1.8 volts on node 120 to keep LVTSCR 200 in this example turned on, LVTSCR 200 remains turned on (latched up) after the ESD event has passed.

Thus, in spite of higher current availability from an LVTSCR after snap back, conventional CMOS integrated circuits are usually protected by grounded gate NMOS snap back structures (GGNMOS) due to the latch-up limitations of LVTSCRs.

What is needed is a device that fills the void between low current GGNMOS devices and low holding voltage, high current SCR and LVTSCR devices.

One proposed solution to increasing the holding voltage of a LVTSCR has been to provide a circuit in conjunction with the LVTSCR which increases the holding voltage by introducing a voltage drop in the form of one or more diodes. This is illustrated in FIG. 3 in which a diode 300 is connected in series with the LVTSCR 302 between $V_{dd}$ and ground. The problem with such an isolated diode or diodes string is that it increases the parasitic capacitance and consumes more space.

Furthermore, it is not suitable for all CMOS processes and therefore does not lend itself steadily to implementation using existing process technology.

SUMMARY OF THE INVENTION

The present invention provides an LVTSCR-like structure having an increased holding voltage.

Further, according to the invention, there is provided a LVTSCR-like ESD protection structure having one or more diodes formed in a p-well of the structure.

Further, according to the invention, there is provided a method of increasing the holding voltage of a LVTSCR structure, comprising forming at least one p-n junction inside a p-well of the structure.

Still further, according to the invention, there is provided a method of increasing the holding voltage of a LVTSCR-like structure, comprising providing an alternative current path through a p-well of the structure, other than the pure p-material of the p-well. The current path forming a lower resistance current path than the p-well. The low resistance current path may take the form of p-n junctions formed in the p-well. Thus, diodes are formed in the p-well which provide a low resistance current path once the voltage across the one or more diodes are exceeded.

BRIEF DESCRIPTION OF THE DRAWINGS

FIG. 5 are I-V curves at different temperatures for a conventional LVTSCR;

FIG. 6 are I-V curves at different temperatures for one embodiment of a device of the invention;

FIG. 7 are comparative I-V curves for a conventional LVTSCR and one embodiment of the invention, at high currents;

DETAILED DESCRIPTION OF THE INVENTION

Figure 1:
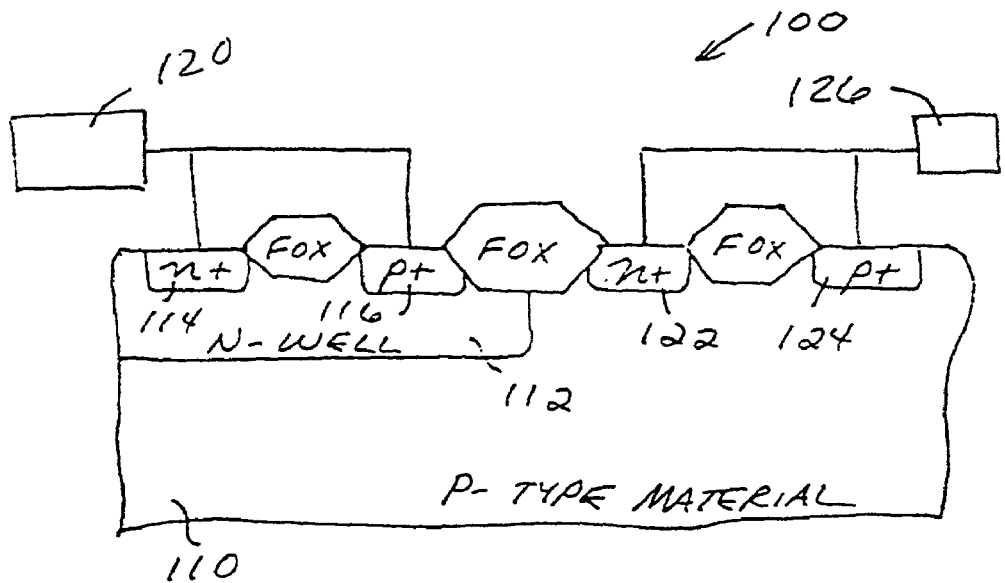
FIG. 1 is a cross-sectional view of a conventional SCR.
Figure 2:
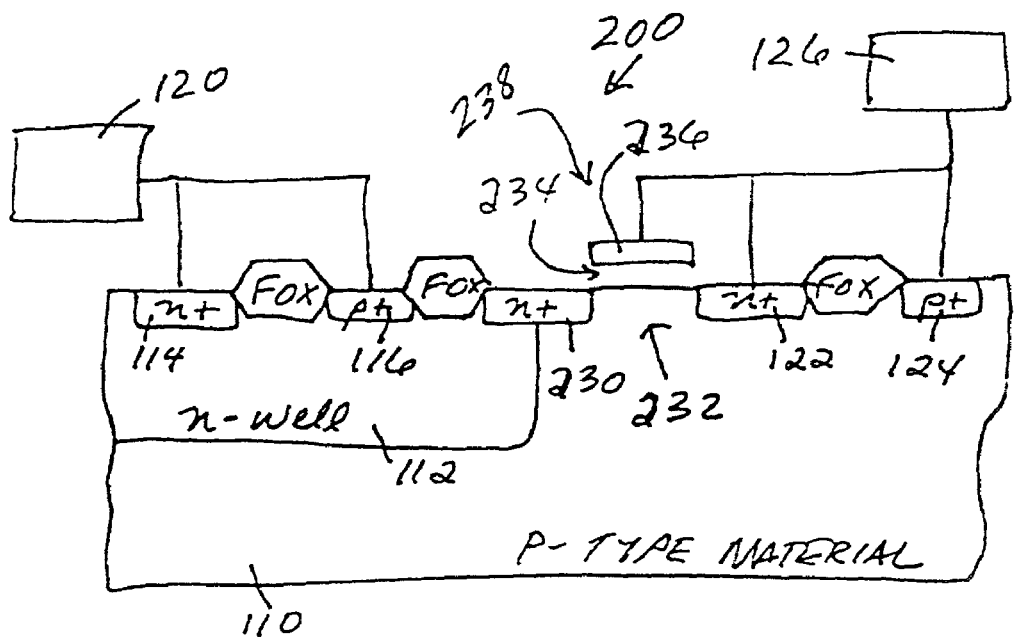
FIG. 2 is a cross-sectional view of a conventional LVTSCR.
Figure 3:
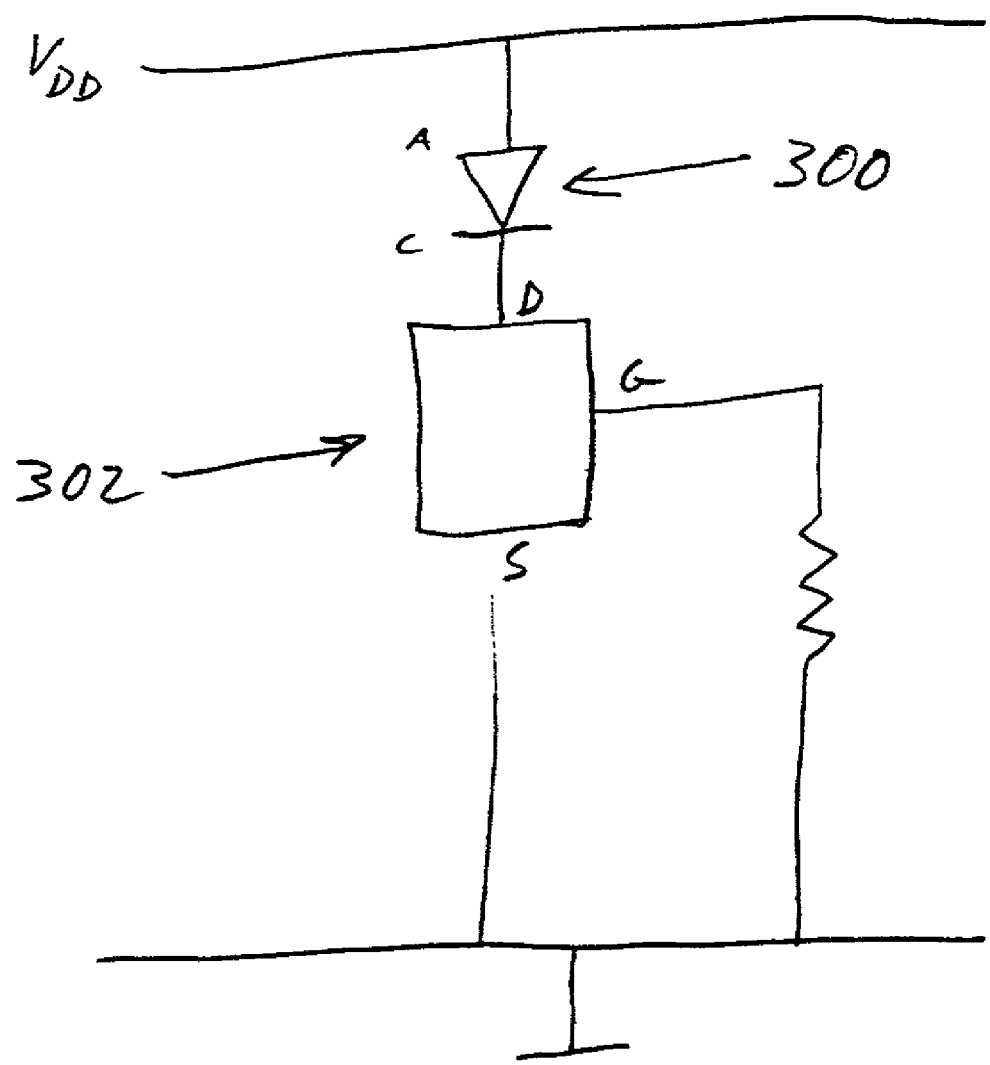
FIG. 3 is a schematic circuit diagram of a LVTSCR protection circuit connected in series with a diode.
Figure 4:
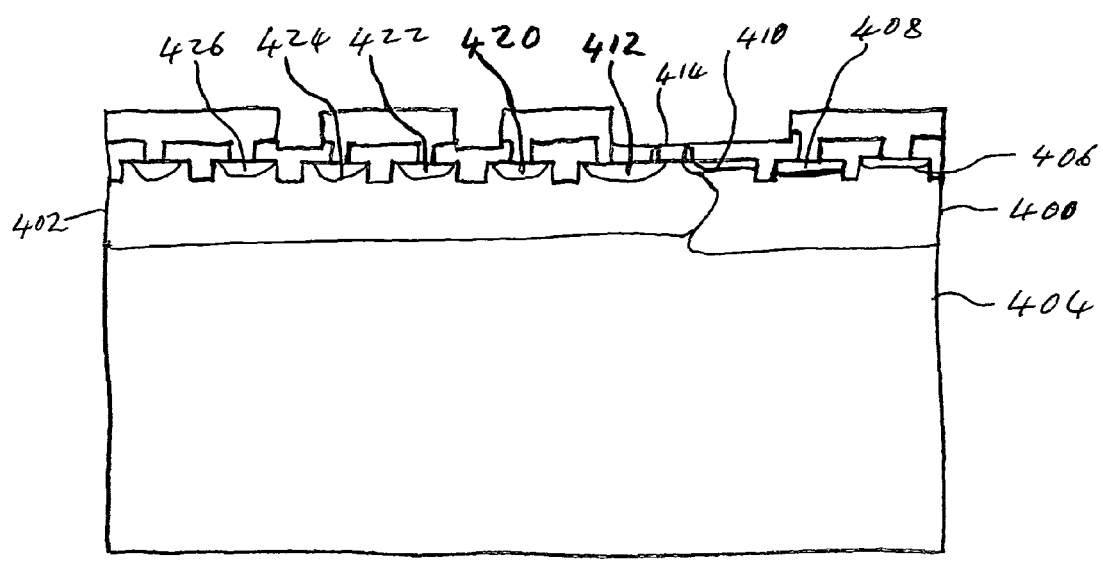
FIG. 4 is a cross-sectional view of one embodiment of a LVTSCR-like structure of the invention.

One embodiment of a LVTSCR-like structure of the invention is illustrated in FIG. 4 in which a n-well 400 and a p-well 402 are formed in a substrate 404. As in the case of a conventional LVTSCR, a n+ drain region 406 and p+ emitter/drain 408 are formed in the n-well 400. A floating drain 410 is also formed in the n-well 400, and extends into the p-well 402. A n+ source 412 is formed in the p-well 402, and a gate 414 is defined over a channel region between the floating drain 410 and the n+ source 412. Furthermore, the embodiment of the invention illustrated in FIG. 4 includes two diodes comprising a first p+ region 420, a first n+ region 422, a second p+ region 424, and a second n+ region 426 formed in the p-well 402. The first p+ and n+ regions 420, 422 define the anode and cathode respectively of a diode formed in the p-well, by defining a p-n junction in the p-well. The second p+ and n+ regions 424, 426 define the anode and cathode respectively of a second diode formed in the p-well 402.

A low currents before the threshold voltage of the diodes is exceeded, current flows substantially through the p-well since the diodes are essentially short circuited by the p-well resistance. Therefore, the breakdown and triggering voltages are not adversely effected by the addition of the diodes, as is illustrated in FIGS. 5 and 6. FIG. 5 shows drain current against drain-source voltage for a conventional LVTSCR at 300K (curve 500), at 325K (curve 502), and at 400K (curve 504). FIG. 6 shows drain current against drain-source voltage for one embodiment of the invention for temperatures of 300K, 325K, and 400K as indicated by curves 600, 602, 604, respectively. As can be seen by the vertical line 606, the holding voltage for the device of the invention is substantially higher than that for the conventional LVTSCR, whereas the breakdown and triggering voltages are substantially the same as for the conventional device.

At high currents after triggering, the internal diode current path is used which defines a correspondingly higher holding voltage as determined by the SCR structure and the two diodes, thereby defining a holding voltage of approximately 1.5V plus two times 1V. This is evident in FIG. 6, which shows a higher holding voltage, as defined by the vertical line 606. This is also illustrated in FIG. 7 which shows the drain current against drain-source voltage for a device of the invention (curve 700) compared to that of a conventional LVTSCR (Curve 702).

Figure 8:
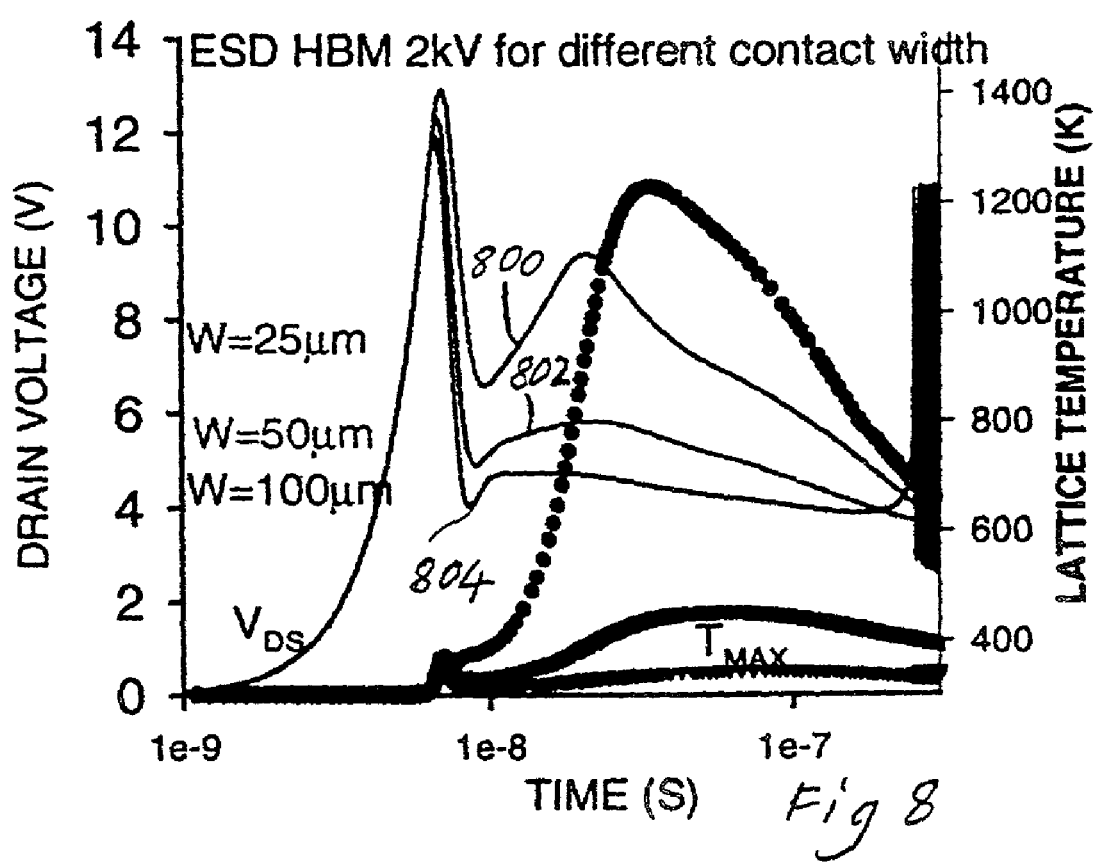
FIG. 8 shows drain voltage-time curves and lattice temperature-time curves at different widths for one embodiment of the invention.
Figure 9:
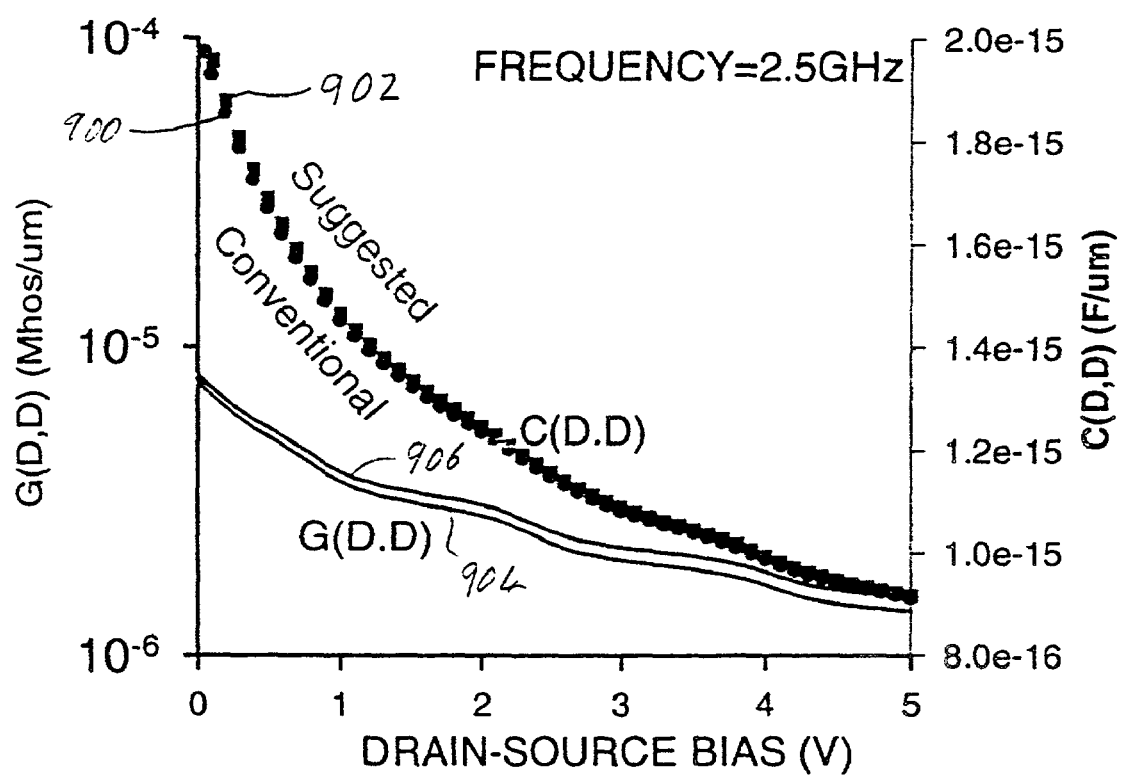
FIG. 9 are conduction and capacitance curves plotted against bias voltage for a conventional LVTSCR and one embodiment of a device of the invention.
Figure 10:
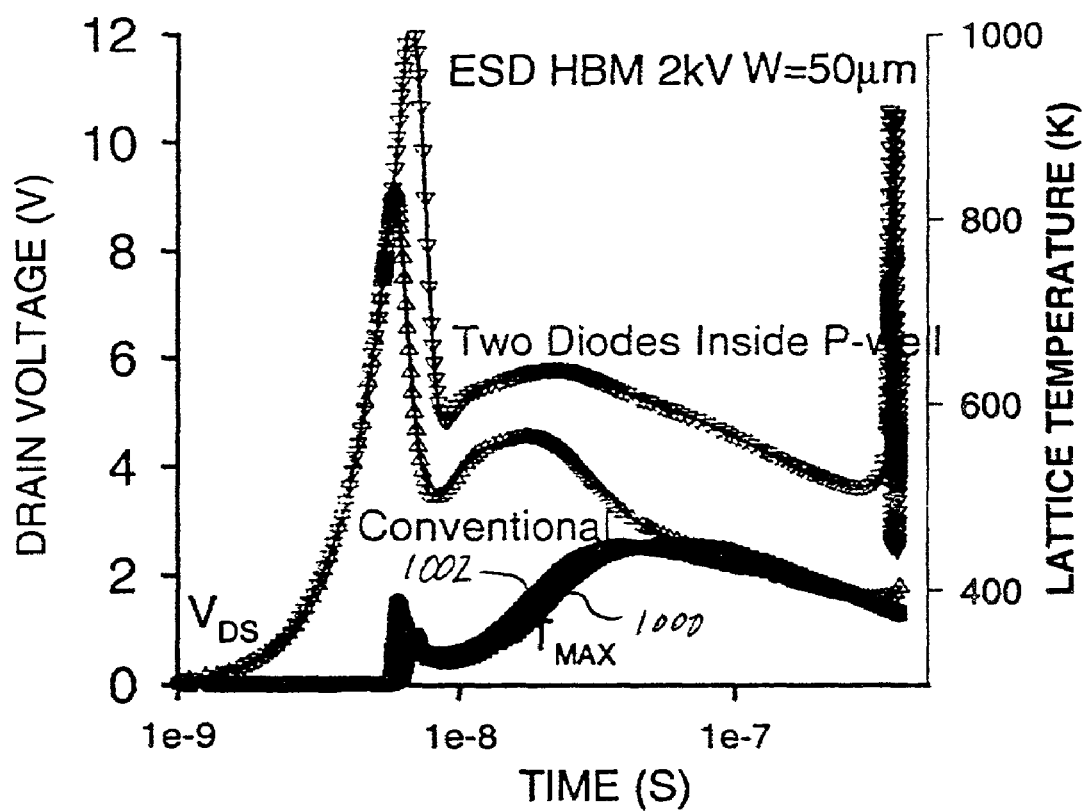
FIG. 10 shows temperature-time and drain voltage-time curves for a conventional device and a device of the invention.

The present invention displays a number of advantages over the prior art. It provides for a simple interconnect layout and a compact design by providing a straightforward serial arrangement. Simulation results have also shown that compared to prior art high holding voltage SCR designs, the present invention displays little sensitivity to process variations, doping levels, and dimension variations. FIG. 8 shows voltage curves 800, 802, and 804 for widths w=25 µm, 50 µm, and 100 µm, respectively. Furthermore, since the diodes are formed inside the grounded p-well 402, the structure does not increase the capacitance over that of a conventional LVTSCR. This is illustrated by the curves in FIG. 9 showing the capacitance variation with drain-source bias for a conventional device (curve 900) compared to that of a device of the invention (curve 902). FIG. 9 also shows that the conductance curves for a device of the invention (curve 904) remains essentially the same as that for a conventional LVTSCR (curve 906). Furthermore, the holding voltage displays a low temperature curve. Referring to FIG. 10, the lattice temperature variation for a device of the invention (curve 1000) is substantially the same as that for a conventional device (curve 1002). Also, the holding voltage is shown to be higher for the device of the invention.

According to TCAD simulations, for a 2 kV HBM pulse, ESD protection with a holding voltage of more than 3.5V can be achieved with an initial substrate temperature range of less than 400K, even at a 25 µm contact with. This was also shown to have a parasitic capacitance of below 14 fF.

It will be appreciated that the p-n structures formed in the p-well of the structure may vary in number and shape, and that the invention can be implemented in a number of ways to achieve an alternative current path at high currents, other than a current path through the p-well, wherein the alternative current path defines a voltage drop which increases the holding voltage of the structure.

What is claimed is:

1. A method of increasing the holding voltage of an LVTSCR structure, comprising forming an n-well and a p-well in a substrate, forming a first n+ region and a first p+ region in the n-well wherein the first n+ region defines a drain, forming a second n+ region and a second p+ region in the p-well wherein the second n+ region defines a source, providing a gate above a channel region, the channel region is located between the drain and the source, and forming an additional n+ region inside the p-well LVTSCR of the structure to define a p-n junction of a diode between the additional n+ region and the p-well, with the second p+ region forming an anode contact to the diode, and the p-n junction of the diode being forward biased during normal operation by having said additional n+ region located at a first distance from the drain and the second p+ region located at a second distance from the drain, wherein the first distance is greater than the second distance.

2. A method of claim 1, further comprising forming at least one additional p+ region and multiple additional n+ regions inside the p-well of the LVTSCR structure to define multiple diodes each with a forward biased p-n junction under normal operation.

\* \* \* \* \*